US008645884B2

(12) United States Patent
Bai

(10) Patent No.: US 8,645,884 B2
(45) Date of Patent: Feb. 4, 2014

(54) MULTI-LAYER MEMORY STRUCTURE FOR BEHAVIORAL MODELING IN A PRE-DISTORTER

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/492,190

(22) Filed: Jun. 8, 2012

(65) Prior Publication Data

US 2013/0241645 A1 Sep. 19, 2013

Related U.S. Application Data

(60) Provisional application No. 61/611,372, filed on Mar. 15, 2012.

(51) Int. Cl.
*G06F 9/455* (2006.01)
*G06F 17/50* (2006.01)

(52) U.S. Cl.
USPC ........... 716/108; 716/113; 375/296; 375/297; 375/346; 330/10; 330/149; 365/194

(58) Field of Classification Search
USPC ........... 716/108, 113; 365/194; 375/296, 297, 375/346, 232; 330/10
See application file for complete search history.

(56) References Cited

U.S. PATENT DOCUMENTS

| | | | | |
|---|---|---|---|---|
| 7,511,574 B2* | 3/2009 | Hongo | ............ | 330/149 |
| 7,679,439 B2* | 3/2010 | Hongo | ............ | 330/149 |
| 8,306,149 B2* | 11/2012 | Mujica et al. | ............ | 375/296 |
| 2003/0058959 A1* | 3/2003 | Rafie et al. | ............ | 375/296 |
| 2005/0163268 A1* | 7/2005 | McCallister | ............ | 375/346 |
| 2005/0258898 A1* | 11/2005 | Hongo | ............ | 330/149 |
| 2006/0171486 A1* | 8/2006 | Tan | ............ | 375/296 |
| 2007/0135065 A1* | 6/2007 | Leffel et al. | ............ | 455/114.3 |
| 2009/0027117 A1* | 1/2009 | Andersen et al. | ............ | 330/10 |
| 2009/0160550 A1* | 6/2009 | Hongo | ............ | 330/149 |
| 2011/0069749 A1* | 3/2011 | Forrester et al. | ............ | 375/232 |

OTHER PUBLICATIONS

Mkadem et al. "Physically Inspired Neural Network Model for RF Power Amplifier Behavioral Modeling and Digital Predistortion" EmRG Research Group, Dep. of Electrical and Computer Engineering, Universit of Waterloo, ON N2L-3G1 Canada. Manuscript revised Oct. 2010. consisting of 12-pages.

* cited by examiner

*Primary Examiner* — Nha Nguyen
*Assistant Examiner* — Brian Ngo
(74) *Attorney, Agent, or Firm* — Christopher & Weisberg, P.A.

(57) ABSTRACT

A method and system for modeling distortion of a non-linear electronic device are disclosed. According to one aspect, the invention provides a layered memory structure that includes a plurality of memory structure layers. Each memory structure layer has an input to receive an input signal and has a memory function. Each memory function has at least one delay element that provides a pre-determined delay of the input signal of the memory structure layer. The pre-determined delay is different for each of at least two memory structure layers and is based at least in part on an evaluation period corresponding to the memory structure layer.

16 Claims, 11 Drawing Sheets

MULTI-LAYER MEMORY STRUCTURE FOR BEHAVIORAL MODELING IN A PRE-DISTORTER

CROSS-REFERENCE TO RELATED APPLICATION

This application is related to and claims priority to U.S. Provisional Patent Application Ser. No. 61/611,372, filed Mar. 15, 2012, entitled MULTI-LAYER MEMORY STRUCTURE FOR BEHAVORIAL MODELING IN A PRE-DISTORTER, the entirety of which is incorporated herein by reference.

TECHNICAL FIELD

The present invention relates to techniques for constructing physical models of non-linear electronic devices and, more particularly, to a method and apparatus for pre-distorting a signal to compensate for distortion subsequently introduced to the signal by a non-linear electronic device.

BACKGROUND

The design of radio-frequency power amplifiers for communications applications often involves a trade-off between linearity and efficiency. Power amplifiers are typically most efficient when operated at or near their saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, digital pre-distortion is applied to the signal at baseband frequencies, i.e., before the signal is up-converted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

Conventionally, a pre-distorter is modeled by a memoryless part and a memory part. The memoryless part may include several branches, each branch applying a different basis function or operation to the input signal to be pre-distorted. The memory part has a branch for each branch of the memoryless part. Each branch of the memory part typically has a structure that includes delay elements, taps and weights to produce a distortion component, $d_k$. The outputs of the branches of the memory part are summed to produce a distortion signal, d. Each of the branches of the memory part may have the same structure.

A problem encountered in pre-distortion architectures is a memory effect phenomenon in which the current output of a power amplifier is a result of previous inputs. This memory effect arises due to the physical interactions of the components of the power amplifier as well as temperature variations. The previous inputs that affect a current output of the power amplifier may have been received in past picoseconds, nanoseconds, microseconds, milliseconds, or even seconds. Such a wide range of memory effects are difficult to model, leading to inefficiencies and non-linear performance.

Thus, there is a need for a memory structure in a pre-distortion architecture that can model a wide range of memory effects exhibited by a non-linear electronic device such as a power amplifier.

SUMMARY

The present invention advantageously provides a method and system for modeling distortion of a non-linear electronic device. According to one aspect, the invention provides a layered memory structure that includes a plurality of memory structure layers. Each memory structure layer has an input that receives an input signal and has a corresponding memory function. Each corresponding memory function has at least one delay element that provides a pre-determined delay of the input signal of the memory structure layer. The pre-determined delay is different for each of at least two memory structure layers and is based on an evaluation period of the corresponding memory structure layer.

According to another aspect, the invention provides a method of compensating for non-linearity of an electronic device. An input to a memory structure is received. The memory structure has K layers. Each layer has a corresponding memory function and each corresponding memory function has a different evaluation period. For each corresponding memory function, the input signal is delayed by multiple delay elements. An output of each of a plurality of the multiple delay elements is tapped to produce a plurality of memory function outputs. A coefficient vector is applied to the memory function outputs. The coefficient vector corresponds to the evaluation period of the memory function.

According to yet another aspect, the invention provides a layered memory structure to receive an input signal and to produce a pre-distorted output signal. The layered memory structure includes a first memory structure layer that receives the input signal and has a first set of delay elements. Each delay element of the first set introduces a pre-determined delay to a signal path of the received signal. The first pre-determined delay is based on a first desired period of evaluation by the first memory structure layer. The layered memory structure includes a second memory structure layer that is in electrical series with the first memory structure layer. The second memory structure layer has a second set of delay elements. Each delay element of the second set introduces a second pre-determined delay to a signal path of the received signal. The second pre-determined delay is based on a second desired period of evaluation by the second memory structure layer.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
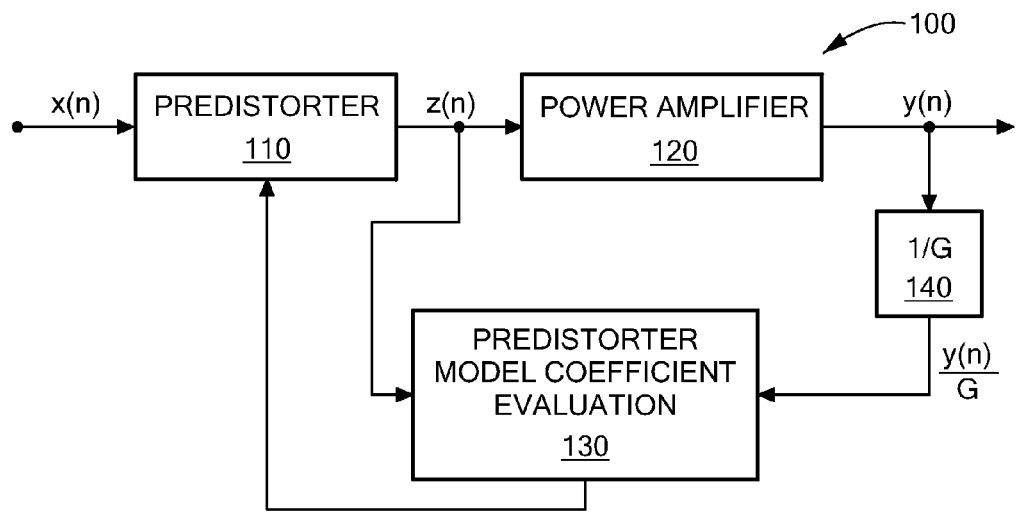
FIG. 1 is a block diagram of an exemplary indirect-learning architecture for a pre-distortion circuit constructed in accordance with principles of the present invention.

Before describing in detail exemplary embodiments that are in accordance with the present invention, it is noted that the embodiments reside primarily in combinations of apparatus components and processing steps related to compensating for distortion in a non-linear electronic device. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1, an exemplary pre-distortion system 100 constructed in accordance with principles of the present invention that is configured to compensate for distortion introduced to a communication signal by a power amplifier 120. As noted above, a power amplifier is typically most efficient when it is operated in a non-linear range. However, the non-linear response of a power amplifier causes unwanted out-of-band emissions and reduces spectral efficiency in a communication system. In the system 100 of FIG. 1, a pre-distorter 110 is used to improve the power amplifier's efficiency and linearity by "pre-distorting" the power amplifier's input signal to compensate for the non-linear distortion introduced by the power amplifier 120. The cascading of the pre-distorter 110 and power amplifier 120 improves the linearity of the output signal, even while power amplifier 120 is operated at high efficiency.

Although pre-distortion is used in the circuits and systems described herein to linearize the output of a power amplifier 120, those skilled in the art will appreciate that the techniques described herein are applicable to characterizing and/or compensating for distortion caused by any type of non-linear electronic device.

As seen in the pre-distortion system 100 of FIG. 1, an input signal x(n) is input to the pre-distorter 110. The pre-distorter 110 pre-distorts the input signal x(n) to compensate for the distortion introduced by the power amplifier 120 when the power amplifier 120 is operated in its non-linear range. The pre-distorted input signal z(n) generated by the pre-distorter 110 is then applied to the input of the power amplifier 120, which amplifies the pre-distorted input signal z(n) to produce an output signal y(n). If the pre-distorter 110 is properly designed and configured, then the output signal y((n) contains fewer distortion products and out-of-band emissions than if the power amplifier 120 were used alone.

To compensate for the distortion introduced by the power amplifier 120, the pre-distorter 110 must have a non-linear transfer function that effectively reverses the non-linear effects of the power amplifier 120. To properly configure the pre-distorter 110, an appropriate model for this non-linear transfer function is created. Two different approaches to deriving this non-linear transfer function are possible. The first approach utilizes an indirect-learning architecture, as depicted in FIG. 1. The second uses the direct-learning architecture of FIG. 2.

In both cases, the signal z(n) input to power amplifier 120 and a scaled version of the power amplifier output signal y(n) is applied to a distortion modeling circuit. In the indirect-learning architecture of FIG. 1, this distortion modeling circuit includes a pre-distorter model coefficient evaluation block 130. In the direct-learning architecture of FIG. 2, the distortion modeling circuit has two functional blocks: a power amplifier model coefficient evaluation block 210 and a pre-distorter model coefficient derivation block 220.

Figure 2:
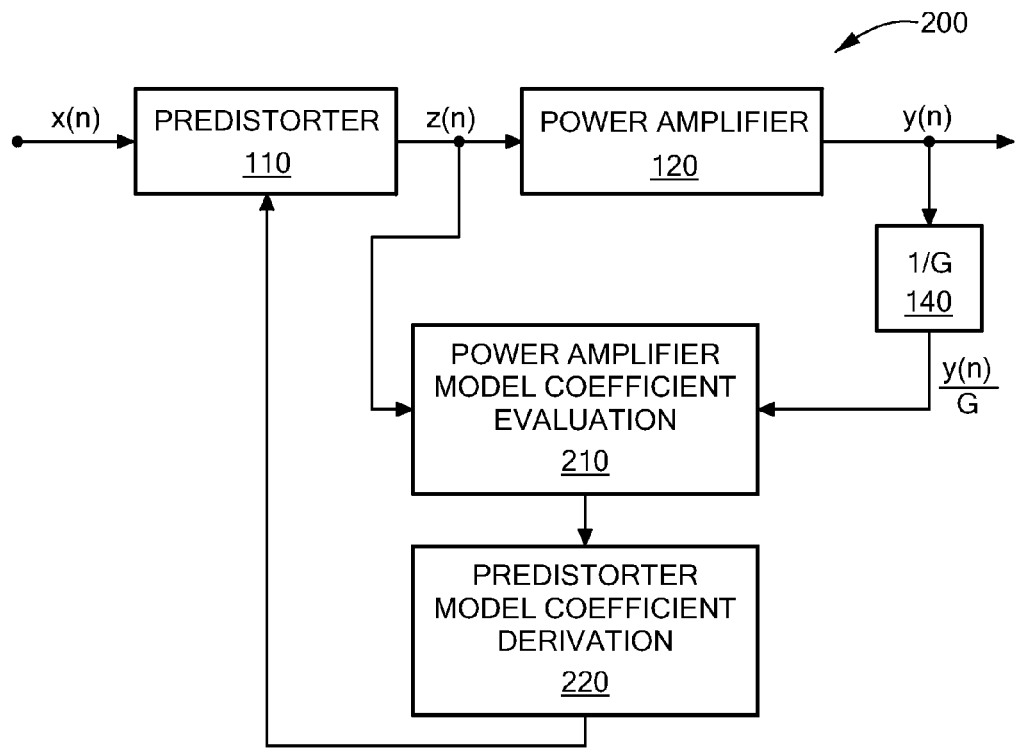
FIG. 2 is a block diagram of an exemplary direct-learning architecture for a pre-distortion circuit constructed in accordance with principles of the present invention.

In either case, the scaling of the power amplifier signal, illustrated as the attenuator 140 in FIGS. 1 and 2, reflects the net linear gain G that is desired from the combination of the pre-distorter 110 and the power amplifier 120. Scaling the output signal y(n) by the inverse of G permits the non-linearities introduced by the power amplifier 120 to be analyzed independently from its gain.

In the indirect-learning architecture of FIG. 1, a general structure for a model of the pre-distorter 110 is assumed, and the pre-distorter model's coefficients (parameters) are estimated directly from the input and outputs of the power amplifier 120. Thus, the pre-distorter modeling circuit 130 evaluates the amplifier input signal z(n) and the scaled amplifier output signal y(n)/G according to a predetermined non-linear model for the pre-distorter 110 to directly determine a set of weighting coefficients to be applied by the pre-distorter 110. In this indirect approach, a model for the power amplifier 120 is not derived. Rather, the non-linear characteristics of the power amplifier 120 are learned indirectly, through the modeling of the pre-distortion needed to counteract the distortion introduced by the power amplifier 120.

In contrast, the direct-learning architecture of FIG. 2 directly characterizes the non-linear performance of the power amplifier 120. First, the power amplifier modeling circuit 210 evaluates the amplifier input signal z(n) and the amplifier output signal y(n)G according to a predetermined non-linear model for the power amplifier 120. The weighting coefficients that best fit the power amplifier's non-linear characteristics to the power amplifier model in block 120 are then used by coefficient derivation circuit 220 to generate weights for configuring the pre-distorter 110.

In the direct-learning architecture, the distortion introduced by the power amplifier 120 is typically represented by a complicated non-linear function, which will be referred to herein as the distortion function. In the indirect-learning architecture, the response of the pre-distorter 110 is represented by a similar non-linear distortion function. In either case, one approach to modeling the distortion function, referred to herein as the decomposition approach, is to decompose the distortion function into a set of less complicated basis functions, each of which separately acts on the input signal. The output of the distortion function is then modeled as the weighted sum of the basis function outputs. The set of basis functions used to model the distortion function is referred to herein as the basis function set.

Figure 3:
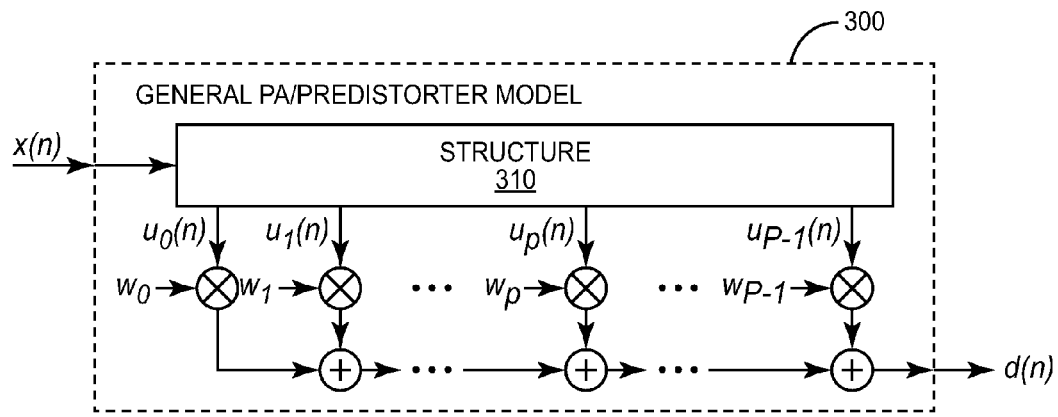
FIG. 3 is a block diagram of an exemplary generic distortion model for modeling distortion introduced by a pre-distorter or power amplifier constructed in accordance with principles of the present invention.

FIG. 3 illustrates a generalized multi-branch distortion model 300, which may represent the distortion introduced by the power amplifier 120 e.g., as modeled by model coefficient evaluation unit 210 in the direct learning architecture of FIG. 2 or the pre-distortion transfer function of the pre-distorter 110 e.g., as modeled by the pre-distorter model coefficient evaluation unit 130 of FIG. 1. In other words, the pre-distortion model 300 may be implemented by the pre-distorter block 110 and the coefficient evaluation unit 130 of FIG. 1 and the coefficient evaluation unit 210 of FIG. 2. In either case, the distortion model 300 includes a structure 310 having P output taps, labeled $u_0(n)$ to $u_{P-1}(n)$. Each of these output taps represents an operation on the input signal x(n), where the operations may correspond to a predetermined basis function set, as discussed in further detail below.

The model structure 310 operates on the input signal x(n) to produce data samples $\{u_0(n), u_1(n), \ldots u_{P-1}(n)\}$. The distortion model 300 then computes a weighted sum of the data samples $\{u_0(n), u_1(n), \ldots u_{P-1}(n)\}$ to obtain a distorted signal d(n). More specifically, the data samples $\{u_0(n), u_1(n), \ldots u_{P-1}(n)\}$ are multiplied by corresponding weighting coefficients $\{w_0(n), w_1(n), \ldots w_{P-1}(n)\}$, and the resulting products are added together to obtain d(n).

The distortion model shown in FIG. 3 can be represented by:

$$d(n) = \sum_{p=0}^{P-1} w_p u_p(n). \quad \text{Eq. 1}$$

Equation 1 can be written as a linear equation according to:

$$d(n) = u^T(n)w, \quad \text{Eq. 2}$$

where u(n) is a P×1 vector of data samples output by the structure at time n, and where w is a P×1 vector of the weighting coefficients.

For a given vector u(n), d(n) is the desired output of the model (e.g., the actual output of the power amplifier 120, in the direct-learning architecture, or the desired output of the pre-distorted 110, in the indirect-learning architecture). The weighting coefficients w that best fit the vector u to the desired output d(n) over a period of time can be learned by fitting multiple observations of u to the corresponding desired outputs d(n). Thus, for a set of observations taken at N sampling instances, the corresponding linear equations given by Equation 2 can be expressed as:

$$U \cdot w = d \quad \text{Eq. 3}$$

where U is an N×P matrix of data signals and d is the desired output signal vector of the distortion model. The columns of the matrix U correspond to the data samples output by the structure 130, while each row of the matrix corresponds to a different sampling instance. Equation 3 can be evaluated according to well known techniques e.g., to minimize a criterion such as a least-square-error criterion to find the weights w that best model the distortion of the power amplifier 120 or the pre-distorter 110.

Figure 4:
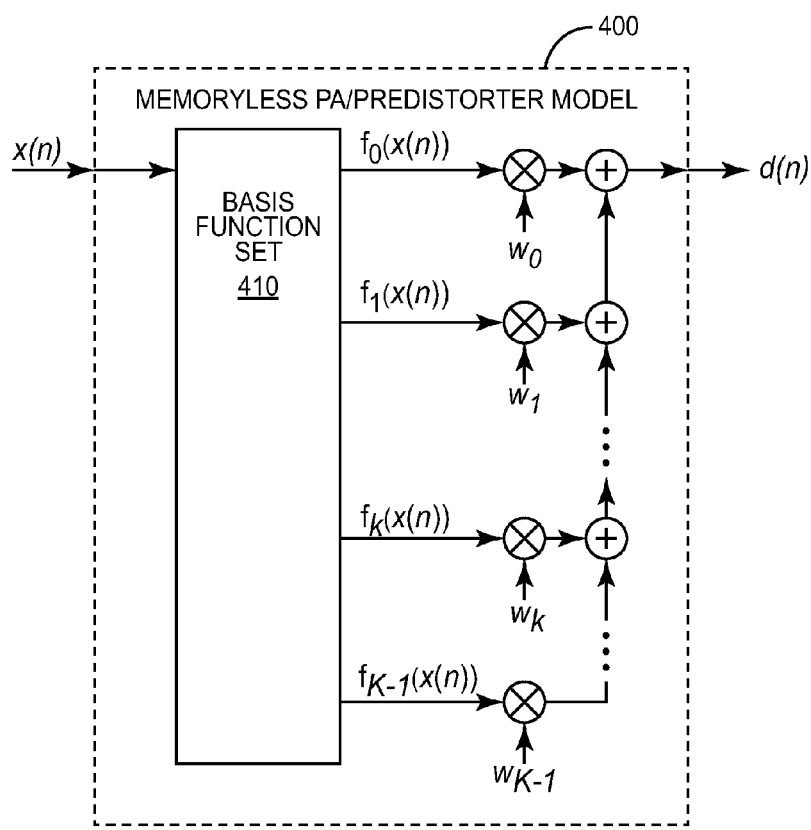
FIG. 4 is a block diagram of an exemplary memoryless distortion model for modeling distortion introduced by a pre-distorter or power amplifier constructed in accordance with principles of the present invention.

FIG. 4 is a block diagram of an exemplary embodiment of a memoryless, multi-branch distortion model 400 for modeling a distortion function, as may be implemented by the pre-distorter 110 and the coefficient evaluation block 130, 210. In distortion model 400, the basic structure of the model is determined by a basis function set 410, comprising multiple basis functions. Each of the K branches in the model corresponds to one of these basis functions, which each operate on the input signal x(n) and which are represented in FIG. 4 as $f_0(x(n))$ to $f_{K-1}(x(n))$. In this memoryless model, these functions each operate only on a present sample x(n) of the input signal, and thus are "memoryless" functions. Like the functions u(n) in the more general model illustrated in FIG. 3, each of the basis function output signals $\{f_0(x(n)), f_1(x(n)), \ldots f_{K-1}(x(n))\}$ are multiplied by corresponding weighting coefficients $\{w_0(n), w_1(n), \ldots w_{K-1}(n)\}$ and added together to obtain d(n).

A difference between the models of FIG. 3 and FIG. 4 is that the functions $f_0(x(n))$ to $f_{K-1}(x(n))$ in FIG. 4 are constrained to be memoryless. Thus, the model of FIG. 4 can be viewed as a special case of the model of FIG. 3, where each of the functions $f_0(x(n))$ to $f_{K-1}(x(n))$ corresponds to one of the functions $\{u_0(n), u_1(n), \ldots u_{P-1}(n)\}$ in FIG. 3.

Accordingly, the weights w that best model the distortion of the power amplifier 120 or the pre-distorter 110 can be found in a similar manner to that described above, e.g., by fitting a matrix of N observations of the outputs of basis function set 410 to a desired output signal vector d. Of course, because the model 400 does not account for memory effects, the accuracy of this model relative to the actual distortion function of a given power amplifier may be limited.

Figure 5:
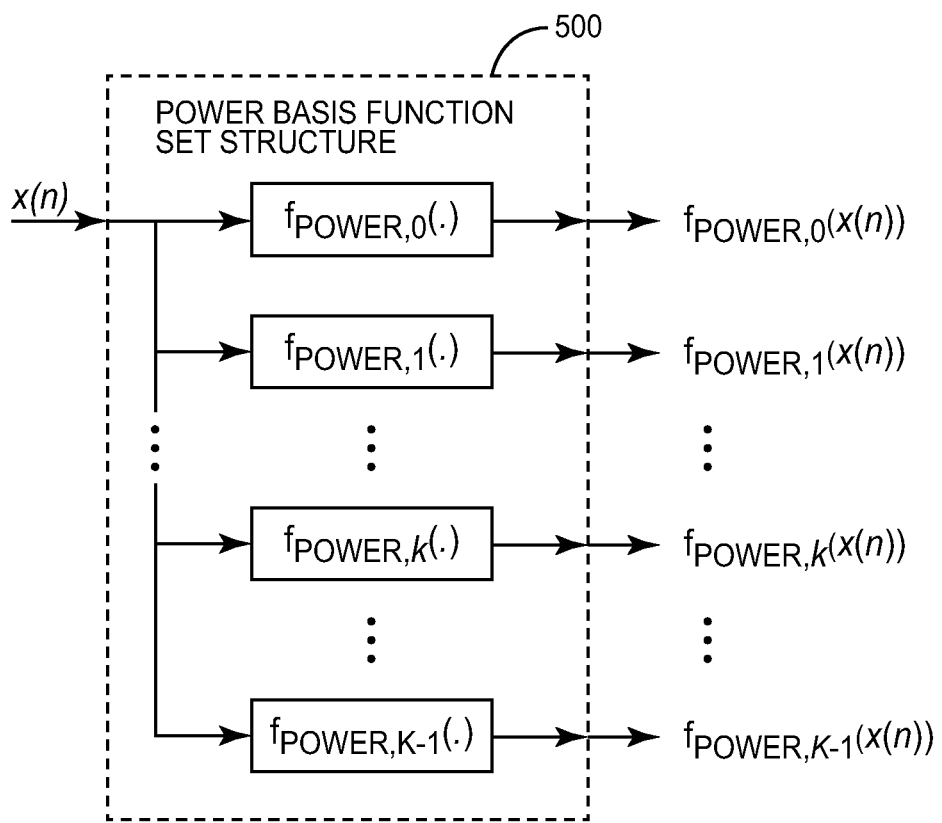
FIG. 5 is a block diagram of an exemplary basis function set structure based on the use of power functions constructed in accordance with principles of the present invention.

In some embodiments of this model, the basis function set 410 may include a set of power functions. This is illustrated in FIG. 5, where basis function set 500 has K outputs designated $f_{POWER,0}(x(n))$ to $f_{POWER,K-1}(x(n))$, where $f_{POWER,k}(x(n))=x(n)|x(n)|^k$. If the power basis function set 500 of FIG. 5 is used to model a distortion transfer function, then the basis function set 500 corresponds to the basis function set 410 of FIG. 4 and structure 310 of FIG. 3. Thus, the data samples $\{u_0(n), u_1(n), \ldots u_{P-1}(n)\}$ correspond to the outputs form the power basis functions $\{f_{POWER,0}(x(n)), f_{POWER,1}(x(n)), \ldots f_{POWER,K-1}(x(n))\}$ (where P=K). A matrix U, comprising N observations of the outputs of the power basis function set 500, can be formed and fitted to a desired output signal vector d to determine the weighting coefficients w that most closely model the desired distortion function.

Figure 6:
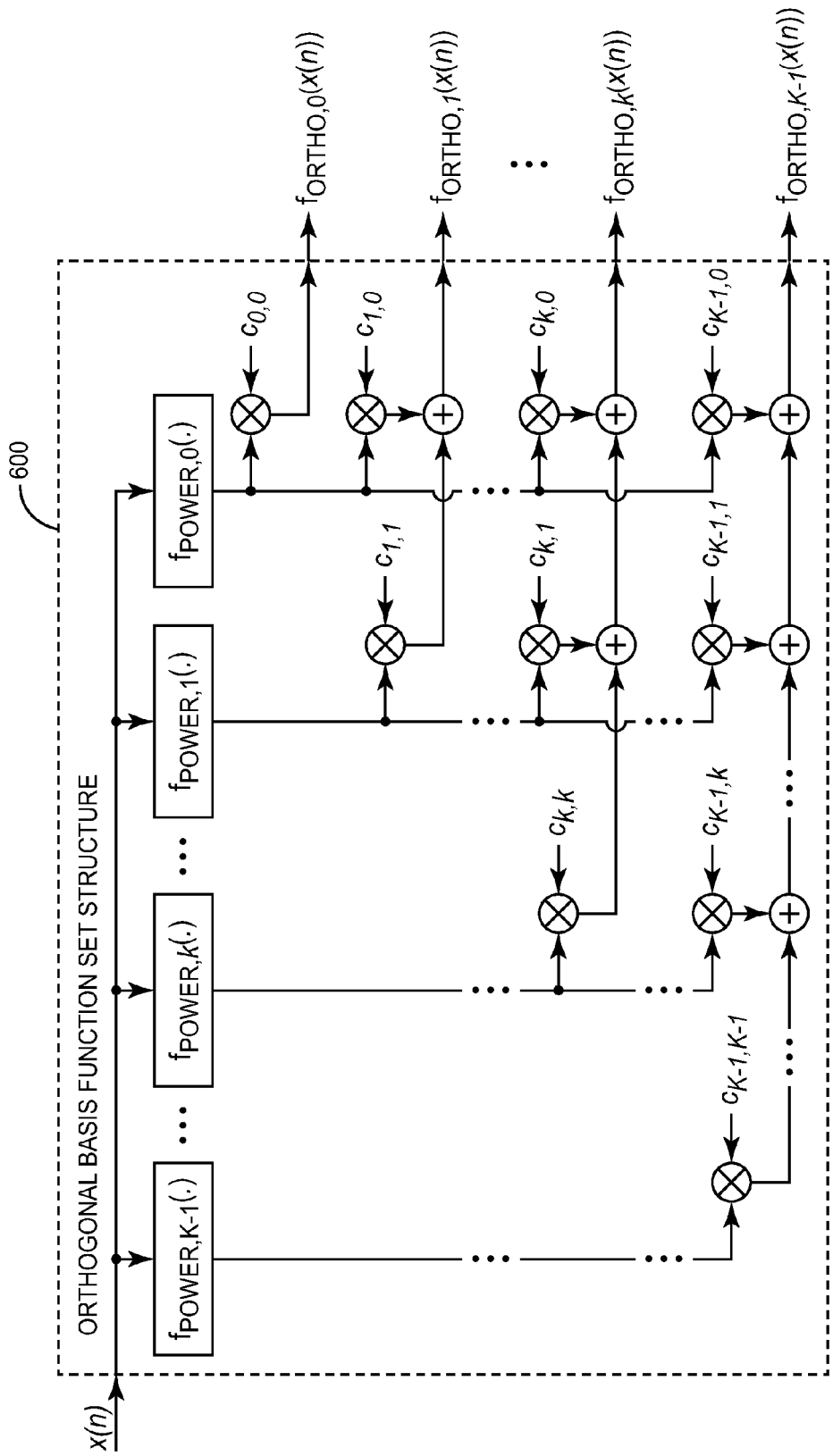
FIG. 6 is a block diagram of an exemplary orthogonal basis function set structure for modeling distortion constructed in accordance with principles of the present invention.

An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models. FIG. 6 illustrates the basis function set structure 600 for an orthogonal basis function set, where the outputs $f_{ORTHO,0}(x(n))$ to $f_{ORTHO,K-1}(x(n))$ correspond to the output samples $\{u_0(n), u_1(n), \ldots u_{P-1}(n)\}$ of the general model 300 of FIG. 3. In this case, each data sample $u_k(n)$ can be expressed as:

$$u_k(n) = f_{ORTHO,k}(x(n)) = \sum_{h=0}^{k} c_{k,h} f_{POWER,h}(x(n)) \qquad \text{Eq. 4}$$

where the subscript, 'ORTHO,k' of the tap function $f_{ORTHO,k}(x(n))$ denotes an orthogonal basis function of the k-th order. Each connection coefficient $c_{k,h}$ is the weight for the h-th order power basis function, $f_{POWER,h}(x(n))$, used in the summations of FIG. 6 to obtain the k-th order orthogonal basis function, $f_{ORTHO,k}(x(n))$. A given ensemble of coefficients $c_{k,h}$ identifies a particular orthogonal basis function set (as given by Equation 4).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
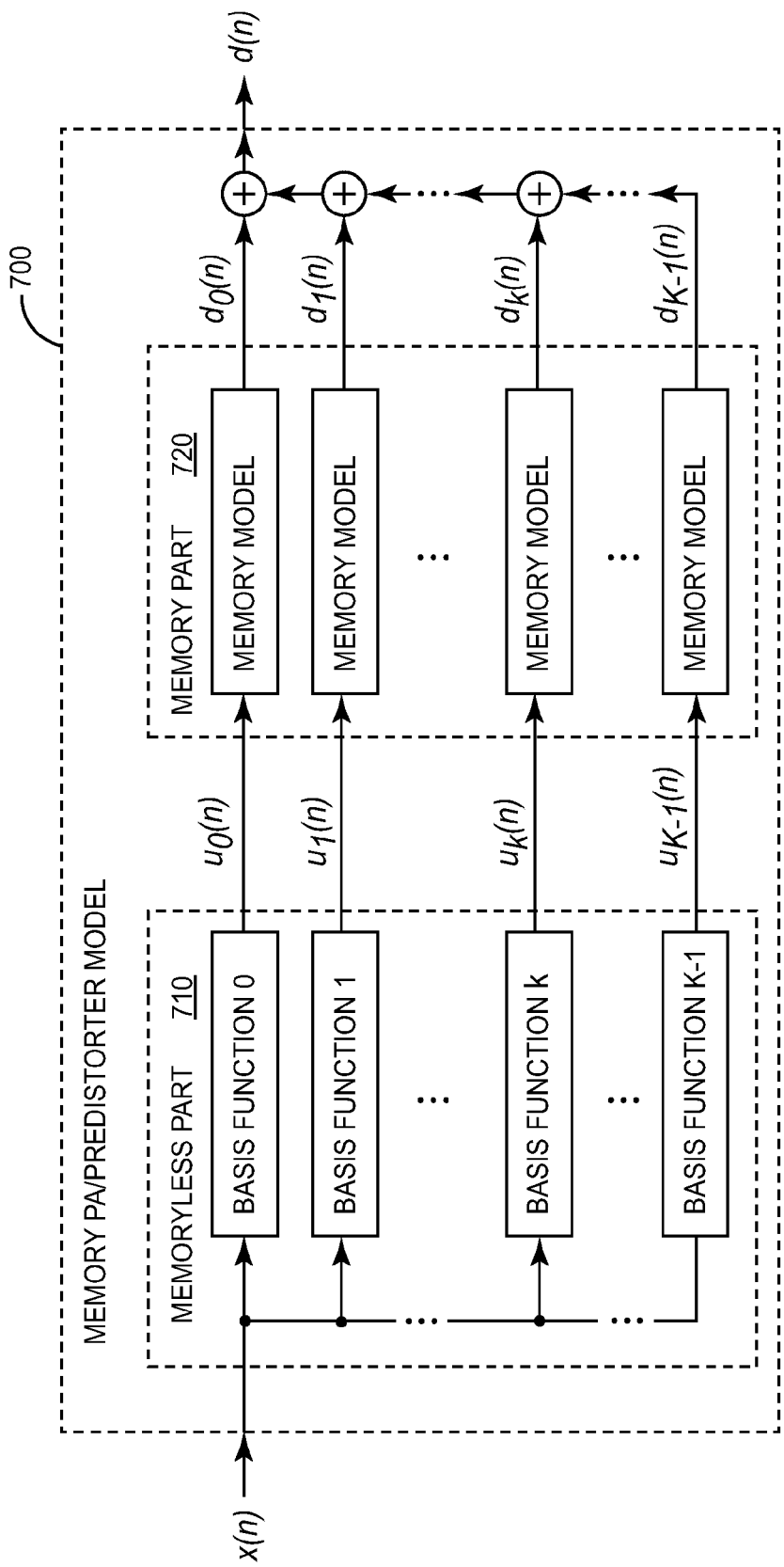
FIG. 7 is a block diagram of an exemplary pre-distortion model that includes a memoryless part and a memory part constructed in accordance with principles of the present invention.

Memory effects, i.e., the dependence of an output signal on prior states of the input signal as well as on the present state, can also be incorporated into a distortion function. FIG. 7 is a block diagram of an exemplary non-linear distortion model 700 that includes memory. In FIG. 7, the model is divided into a memoryless part 710 and a memory part 720, where the memory part 720 models memory effects corresponding to each of the K basis functions. Accordingly, the basis functions in each of the K branches in the memoryless part 710 supply basis function output signals to corresponding memory models in the memory part 720. The output from each memory model can generally be viewed as a weighted sum of the basis function output signal and/or delayed versions of the basis function output signal. For example, if the basis function for branch k is $f_k(\cdot)$ and the input signal is x(n), then the output of branch k is a weighted sum of $f_k(x(n))$, $f_k(x(n-1))$, $f_k(x(n-2))$, etc. The K outputs from the K branches are summed to form the desired distortion signal d(n).

Figure 8:
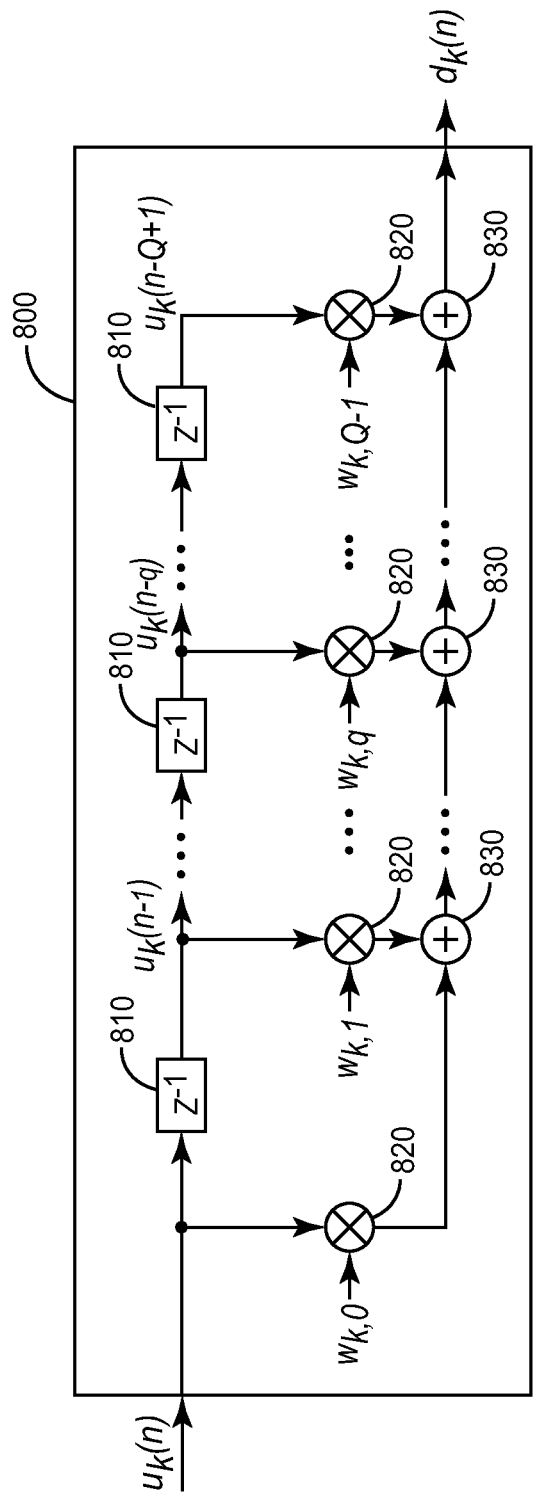
FIG. 8 is a block diagram of an exemplary memory model based on a tapped delay line with unit delays constructed in accordance with principles of the present invention.

The memory models in memory part 720 may have any of a variety of structures. One possible structure, a tapped delay line model with unit delays, is illustrated in FIG. 8. The illustrated memory model 800 corresponds to a single one of the memory models in the memory part 720 of FIG. 7. Thus, a K-branch distortion model using the tapped delay line memory model 800 of FIG. 8 would include K instances of the memory model 800.

In the tapped-delay-line memory model structure pictured in FIG. 8, delay elements 810 (labeled with $Z^{-1}$) represent unit delays. Thus, if the input to the memory model 800 is a present sample $u_k(n)$ of the input signal, then the output of the leftmost delay element 810 is the most recent previous sample of the input signal, i.e., $u_k(n-1)$. The output of the next delay element 810 to the right is the sample prior to that one, i.e., $u_k(n-2)$. This continues through the Q-1 delay elements 810. Thus, the memory model 800 of FIG. 8 is said to have a memory depth of Q.

Each of the Q "taps" in the memory model 800, i.e., the data samples $u_k(n)$ to $u_k(n-Q+1)$, are multiplied by corresponding weights $w_{k,0}$ to $w_{k,Q-1}$, with multipliers 820. The resulting products are summed together, with adders 830, to form a branch output signal $d_k(n)$. Referring to FIG. 7, the branch output signals $d_k(n)$ are summed to form the desired distortion signal d(n). The structure depicted in FIG. 8 can be represented by the following equation:

$$d_k(n) = \sum_{q=0}^{Q-1} w_{k,q} u_k(n-q). \qquad \text{Eq. 5}$$

In the tapped-delay-line memory model of FIG. 8, a distinct memory function can be applied to each basis function output signal $u_k$. By configuring the weights $w_{k,q}$, any arbitrary weighted sum of the basis function output signal $u_k$ and earlier samples of the basis function output signal can be formed, up to the memory depth of Q. This allows a great deal of flexibility in modeling the memory effects of an electronic device. Q is typically chosen to ensure that that the time interval covered by Q consecutive samples is sufficient to span the most significant memory effects of the modeled distortion transfer function.

Figure 9:
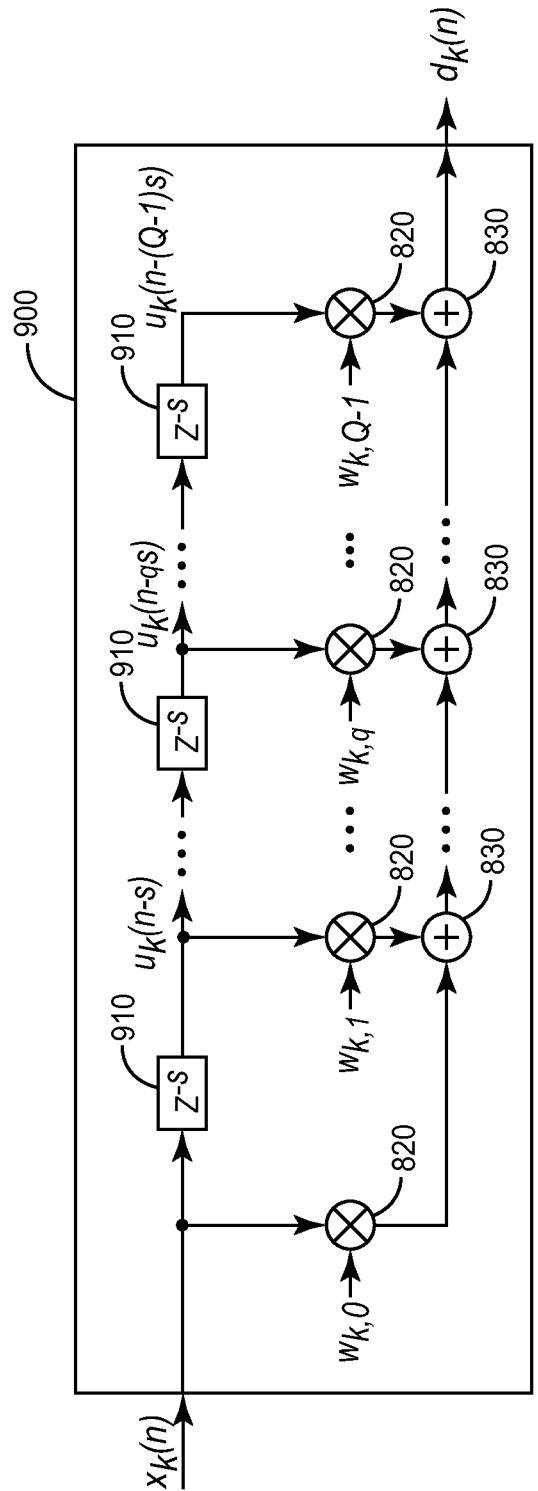
FIG. 9 is a block diagram of an exemplary memory model based on a tapped delay line with non-unit delays constructed in accordance with principles of the present invention.

Another exemplary memory model structure is shown in FIG. 9. The memory model 900 has a tapped-delay-line structure similar to the memory model 800. However, instead of the unit-delay elements 810 of FIG. 8, the memory model 900 includes several non-unit delay elements 910. These non-unit delay elements 930 are labeled $Z^{-s}$, indicating that each non-unit delay element delays its input signal by s sampling intervals, where s>1. If s=1, then the memory model 900 would be identical to the memory model 800. The structure depicted in FIG. 9 can be represented by the following equation:

$$d_k(n) = \sum_{q=0}^{Q-1} w_{k,q} u_k(n-qs) \qquad \text{Eq. 6}$$

This structure allows longer memory effects to be modeled, compared to a unit-delay tapped-delay line structure having the same number of taps. However, the resulting model will have less resolution in the time domain.

Figure 10:
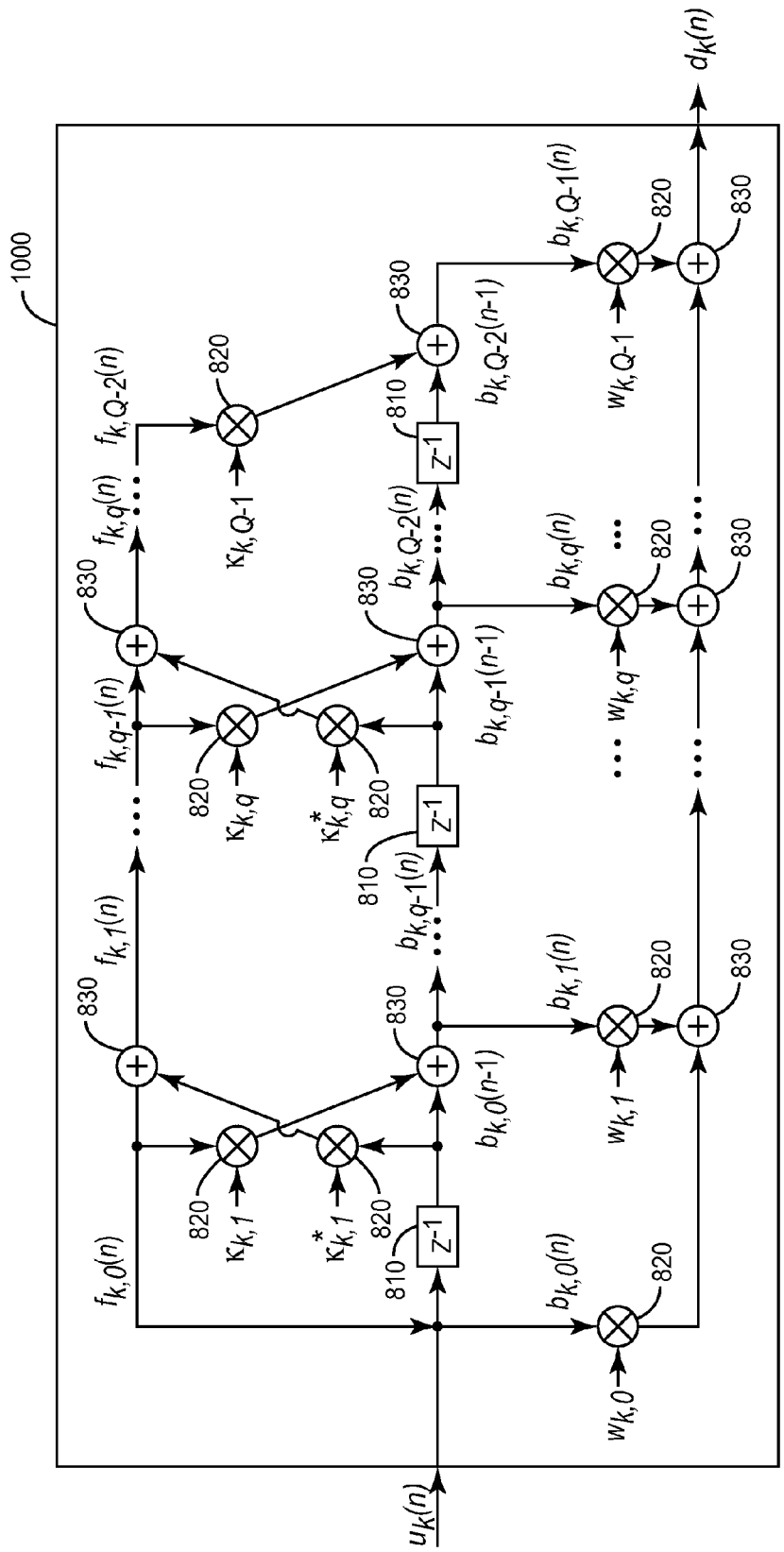
FIG. 10 is a block diagram of an exemplary memory model based on a predictive lattice with unit delays constructed in accordance with principles of the present invention.

Still another memory model structure is shown in FIG. 10, which illustrates a lattice predictor memory model 1000. In the lattice predictor memory model 1000, $f_{k,q}(n)$ and $b_{k,q}(n)$ are the q-th order forward and backward prediction errors, respectively, at time n. $\kappa_{k,q}$ is th q-th order reflection coefficient, and the superscript '*' denotes the conjugate transpose operation. It should be noted that in the predictive lattice memory model structure, the backward prediction error of a given order is delayed by one time unit, through unit-delay elements 810, before being used to evaluate the backward prediction error of the next order.

The structure depicted in FIG. 10 can be represented by the following algorithm:

1. q=0 (initialization):

$$f_{k,0}(n) = b_{k,0}(n) = u_k(n) \qquad \text{Eq. 7}$$

2. q=1, ..., Q-2 (first stage to the second-to-last stage):

$$f_{k,q}(n) = f_{k,-1}(n) + \kappa_{k,q} b_{k,q-1}(n-1) \qquad \text{Eq. 8}$$

$$b_{k,q}(n) = \kappa^*_{k,q-1}(n) + b_{k,q-1}(n-1) \qquad \text{Eq. 9}$$

3. q=Q−1 (the last stage; $f_{k,Q-1}(n)$ does not need to be computed):

$$b_{k,Q-1}(n) = \kappa_{k,Q-1} f_{k,Q-2}(n) + b_{k,Q-2}(n-1) \quad \text{Eq. 10}$$

An estimate $\hat{\kappa}_{k,q}$ of the q-th order reflection coefficient can be evaluated based on a typical set of data of length N using the Burg estimate as:

$$\hat{\kappa}_{k,q} = \frac{2 \sum_{n=m+1}^{N} b_{k,q-1}(n-1) f_{k,q-1}^*(n)}{\sum_{n=m+1}^{N} [|f_{k,q-1}(n)|^2 + |b_{k,q-1}(n-1)|^2]} \quad \text{Eq. 11}$$

Note that in Equation 11, the start value of both summations are set to n=m+1 to exclude zero terms, based on the assumption that $n_k(n)=0$ for n<0.

Each of the distortion models in FIGS. 3-7 includes a set of taps, or data samples, that are weighted and summed to form the "desired" distortion signal d(n), as follows:

$$u_{1 \times P}^T(n) \cdot \underset{P \times 1}{w} = d(n) \quad \text{Eq. 12}$$

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of x(n−1), x(n−2), etc. Note that in Equation 12 and as generally used herein, $(\cdot)^T$ denotes a transpose, $(\cdot)^H$ denotes a conjugate transpose, P is the number of coefficients in the model, the P×1 vector u(n) denotes all of the data samples in the model at a given time index n, the P×1 vector w denotes all the coefficients in the distortion model, and d(n) is the desired output of the model for time instance n.

For any given time index n, both u(n) and d(n) are known, and Equation 12 is a linear equation of w. As noted earlier, for observations obtained on N time indices, the corresponding linear equations expressed in Equation 12 can be compactly expressed as:

$$\underset{N \times P}{U} \cdot \underset{P \times 1}{w} = \underset{N \times 1}{d} \quad \text{Eq. 13}$$

In Equation 13, U is the input data matrix and d is the desired output vector.

In the indirect-learning architecture of FIG. 1, d(n) is the desired output of the pre-distorter 110, which ideally has a distortion function that compensates for the distortion introduced by power amplifier 120. Thus, d(n) corresponds to z(n), the input to power amplifier 120, when the indirect-learning architecture is used. The input signal to the distortion model, denoted x(n) in FIGS. 3-7, corresponds to the scaled output of the power amplifier 120, y(n)/G. Thus, for any given model structure, samples of the output from the power amplifier 120 are taken for each of N sampling instances and applied to a set of basis functions to produce a matrix U. This matrix U is fitted to the desired output vector d according to Equation 13, where d is a vector of samples of the input to power amplifier, taken at the same N sampling instances used to form the matrix U.

As discussed earlier, the distortion characteristics for the power amplifier are modeled directly in the direct-learning architecture, pictured in FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 13, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in the digital pre-distorter 110 of FIGS. 1 and 2 is the problem of estimating the coefficient vector w based on Equation 13 satisfying a certain criterion. In order to solve this estimation problem, inversion of the data matrix U, or $H^H U$, in some form is required. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, an important goal in the design of a distortion model for a power amplifier or a pre-distorter is to provide the coefficient evaluation algorithm with a data matrix $U^H U$ that has a relatively small number of columns to reduce the computational complexity of the matrix operations, that has a condition number as close to 1 as possible for high numerical stability and that at the same time also models the physical behavior of the power amplifier or pre-distorter as exactly as possible, given a particular optimization criteria. One problem associated with adding memory effects to conventional distortion models is the extra instability added to the coefficient evaluation process due to the introduction of the memory model terms in the model. This problem exists for both the direct and indirect learning architectures.

This added instability is reflected in a significant increase, sometimes as much as by a factor of $10^6$, of the condition number of the data matrix that has to be inverted in the parameter evaluation process. This problem can be quite serious in an adaptive digital pre-distortion system with memory, as the parameters in such a system have to be adapted "on the fly" to track the distortion characteristics of the power amplifier over time.

A fundamental source of this added instability is the high correlation among the data samples used in the coefficient evaluations. This is a result of at least two aspects of the digital pre-distorter. First, successive input data samples to the pre-distorter exhibit high correlation with one another due to the significantly over-sampled nature of the input signal to the pre-distorter. This high correlation is a result of the high ratio, at least on the order of 3-5, of the sampling rate to the baseband bandwidth of the input signal. This high over-sampling ratio is due, in turn, to the fact that the pre-distorter is intended, by design, to distort the input signal. This necessarily causes bandwidth expansion. As a result, the signals processed in the pre-distorter system must be sampled at a rate significantly higher than that necessary to capture the information in the original, undistorted signal.

Also, given a tapped delay line structure for the memory model, consecutive input data samples are directly used to create the matrix U that is used for coefficient evaluations. As a result, the data samples used in the coefficient evaluations exhibit high correlation.

Figure 11:
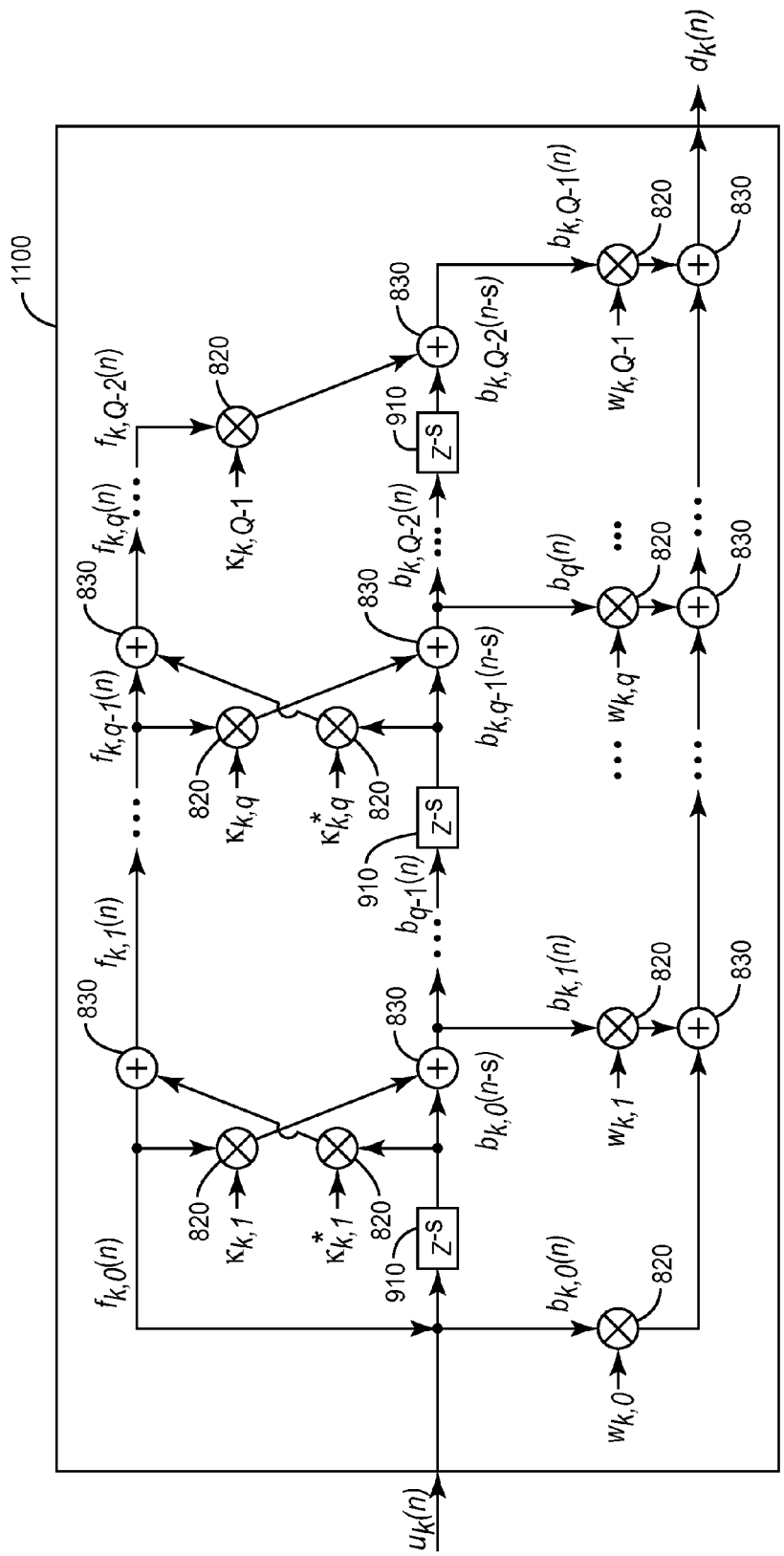
FIG. 11 is a block diagram of an exemplary memory model based on a predictive lattice with non-unit delays constructed in accordance with principles of the present invention.

FIG. 11 illustrates a lattice predictor memory model 1100 that addresses these issues. Lattice predictor memory model 1100 is similar to the model 1000 pictured in FIG. 10, but has non-unit delay elements 910, instead of unit-delay elements. Thus each of the delay elements 910, labeled $Z^{-s}$, delays its input signal by s sampling intervals, where s>1.

The structure depicted in FIG. 11 can be represented by the following algorithm:

1. q=0 (initialization):

$$f_{k,0}(n)=b_{k,0}(n)=u_k(n) \qquad \text{Eq. 14}$$

2. q=1, ..., Q-2 (first stage to the second-to-last stage):

$$f_{k,q}(n)=f_{k,q-1}(n)+\kappa^*_{k,q}b_{k,q-1}(n-s) \qquad \text{Eq. 15}$$

$$b_{k,q}(n)=\kappa_{k,q}f_{k,q-1}(n)+b_{k,q-1}(n-s) \qquad \text{Eq. 16}$$

3. q=Q-1 (the last stage; $f_{k,Q-1}(n)$ does not need to be computed):

$$b_{k,Q-1}(n)=\kappa_{k,Q-1}f_{k,Q-2}(n)+b_{k,Q-2}(n-s) \qquad \text{Eq. 17}$$

An estimate $\hat{\kappa}_{k,q}$ of the q-th order reflection coefficient can be evaluated based on a typical set of data of length N as:

$$\hat{\kappa}_{k,q} = \frac{2 \sum_{n=m+1}^{N} b_{k,q-1}(n-s)f^*_{k,q-1}(n)}{\sum_{n=m+1}^{N} [|f_{k,q-1}(n)|^2 + |b_{k,q-1}(n-s)|^2]} \qquad \text{Eq. 18}$$

Note that in Equation 18, the start value of both summations are again set to n=m+1 to exclude the zero terms based on the assumption that $u_k(n)=0$ for n<0.

The determination of the number of delays between adjacent taps, i.e., the value of s, in the non-unit-delay lattice predictor memory model is based on the trade-off between two factors. First, an increase in the delay between taps, i.e., an increase in s, results in a reduction of the condition number in the data matrix U, due to the decreased correlation between successive data samples in the matrix. This increases the stability of the mathematical computations that are performed to derive the optimal tap weights. Of course, this improvement is subject to diminishing improvements as s becomes larger. Thus, there is a point after which the benefit in terms of condition number reduction is insignificant.

Second, as with the tapped-delay-line structure, an increase in the delay between taps results in degradation of the model's performance, as manifested in terms of normalized mean square error (NMSE) between the model output and the desired signal.

Figure 12:
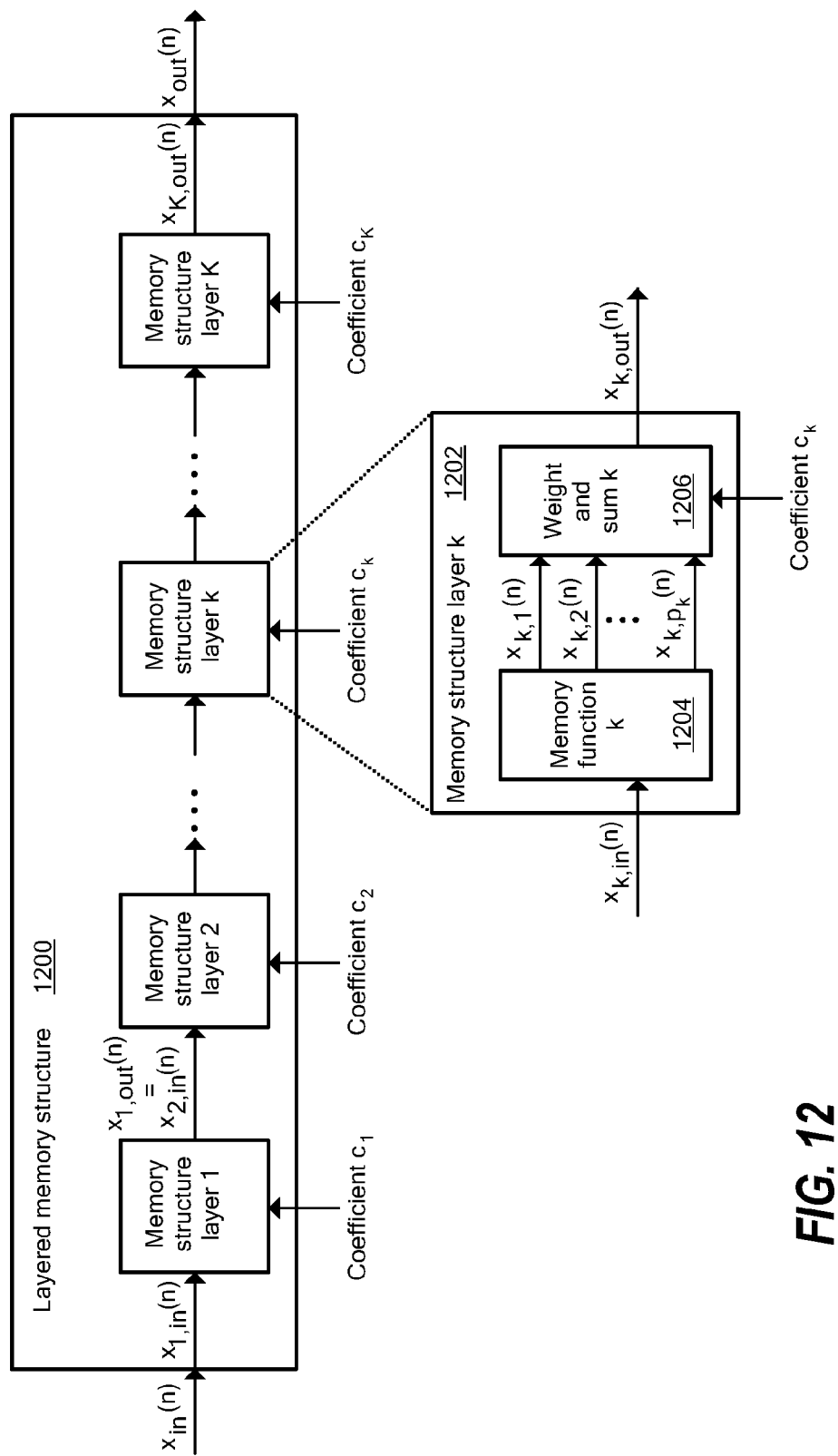
FIG. 12 is a block diagram of an exemplary layered memory structure incorporating series-connected memory structure layers built in accordance with principles of the present invention.

FIG. 12 is a block diagram of an exemplary layered memory structure 1200 incorporating series-connected memory structure layers 1202 built in accordance with principles of the present invention. A layered memory structure 1202 may be one of the memory structures shown in FIGS. 8-11. As shown in FIG. 12, an output of a first memory structure layer may be input to a next memory structure layer. As shown in the expanded view of a memory structure layer 1202, each memory structure layer 1202 may have a memory function 1204, which includes delay elements 810 or 910, and a weight and sum block 1206, which includes multipliers 820.

Each weight and sum block 1206 receives a coefficient vector $c_k$, which contain the weights $w_k$, discussed above with respect to Equation 3, for example, and shown in FIGS. 8-11 as inputs to the multipliers 820. Thus, each layer has its own set of coefficients that are updated independently based on the time scale (evaluation period) to be modeled by that layer. In other words, coefficients for a layer that models a time scale on the order of seconds may be updated less often than coefficients for a layer that models a time scale on the order of milliseconds.

The delays introduced by elements 910 are different for each memory structure layer. For example, a first memory structure layer 1202 may have delay elements 910 where each delay element introduces a delay on the order of picoseconds, whereas a second memory structure layer 1202 has delay elements that have a delay on the order of nanoseconds, and so forth. The coefficient vector $c_k$ received by a memory structure layer is thus based on the evaluation period of the memory structure layer. See, for example, Equation 6 and Equations 14-18. Thus, a wide range of memory effects can be modeled with the layered memory structure 1200.

Figure 13:
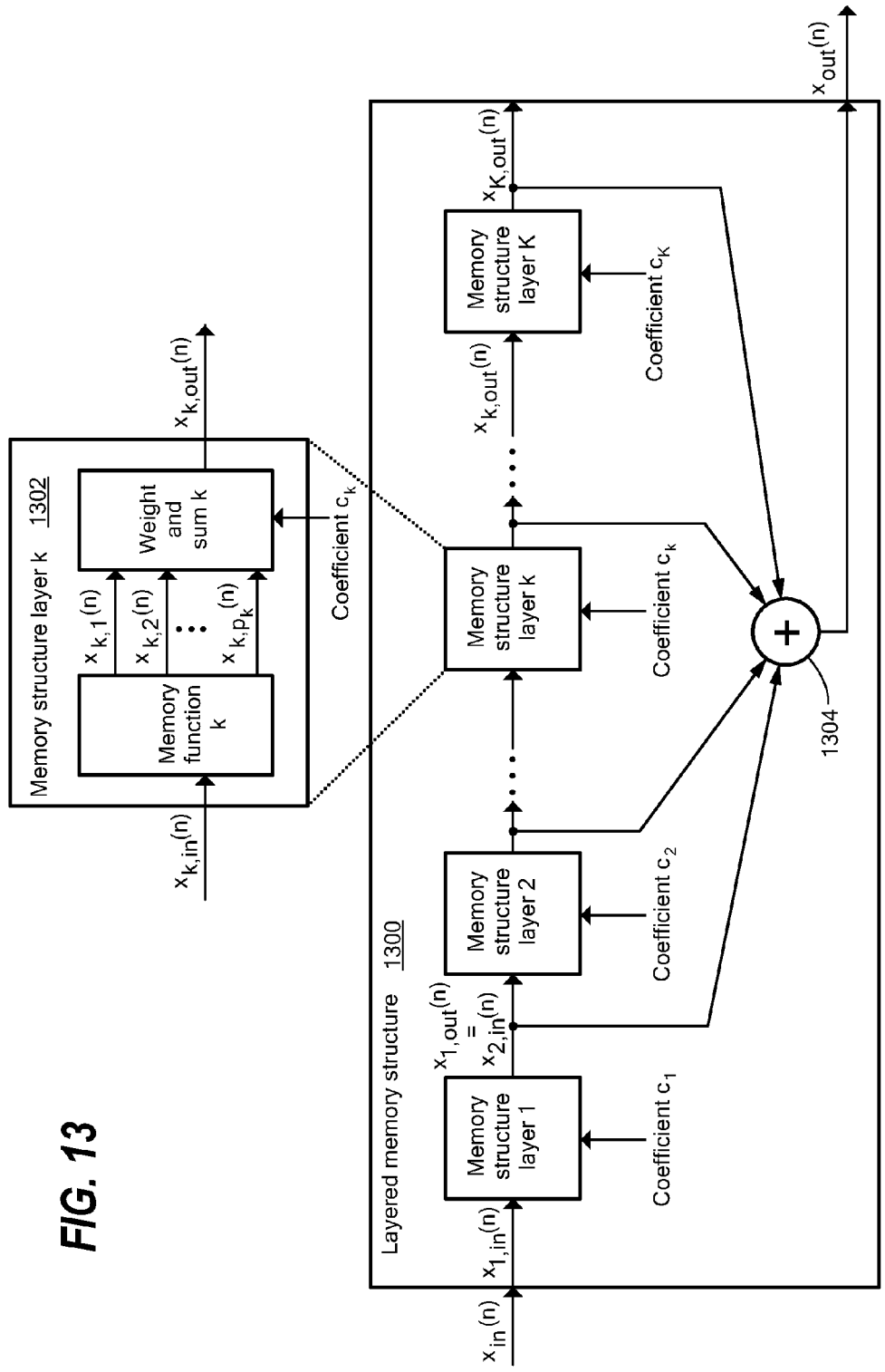
FIG. 13 is a block diagram of an exemplary layered memory structure incorporating parallel-series memory structure layers constructed in accordance with principles of the present invention.

FIG. 13 is a block diagram of an exemplary layered memory structure 1300 incorporating a parallel-series configuration of memory structure layers 1302 constructed in accordance with principles of the present invention. Each memory structure layer 1302 may include delay elements 910 of sufficient delay to model memory effects that range from picoseconds, for example, to seconds. The outputs of each memory structure layer are added by an adder 1304. Once again, the coefficients received by each memory structure layer depends upon an evaluation period of the layer as determined by the amount of delay of the delay elements forming the memory structure layer.

Thus, one embodiment is a layered memory structure that includes a plurality of memory structure layers. Each memory structure layer receives an input signal and has a memory function. Each memory function has at least one delay element that provides a pre-determined delay to the input signal of the layer. The pre-determined delay is different for each of at least two layers and is based on an evaluation period corresponding to the layer. The evaluation period of a layer may be on the order of picoseconds, nanoseconds, microseconds, milliseconds or seconds, etc. For example, a first memory structure layer may have a plurality of taps, with each tap separated by a delay on the order of picoseconds, whereas a second memory structure layer may have a plurality of taps, with each tap separated by a delay on the order of nanoseconds, and so forth. In one embodiment, the memory structure layers are electrically in series, whereas in another embodiment, the memory structure layers are electrically in a parallel-series configuration.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A layered memory structure, comprising:
a plurality of memory structure layers, each memory structure layer having:
an input to receive an input signal;
a corresponding memory function, each corresponding memory function having a plurality of delay elements, each delay element providing a predetermined delay to the input signal of the memory structure layer, the predetermined delay being different for each of at least two memory structure layers and being based at least in part on an evaluation period of the corresponding memory structure layer; and
wherein a predetermined delay for a first memory structure layer of the plurality of memory structure layers is based on a nanosecond evaluation period and a predetermined delay for a second memory structure layer of the plurality of memory structure layers is based on a microsecond evaluation period.

2. The layered memory structure of claim 1, wherein a memory function of a first memory structure layer of the plurality of memory structure layers has a plurality of taps separated by a delay on the order of nanoseconds, and a memory function of a second memory structure layer of the plurality of memory structure layers has a plurality of taps separated by a delay on the order of microseconds.

3. The layered memory structure of claim 2, wherein the second memory structure layer precedes the first memory structure layer.

4. The layered memory structure of claim 1, wherein a memory function of a first memory structure layer of the plurality of memory structure layers has a plurality of taps separated by a delay on the order of seconds, and a memory function of a second memory structure layer of the plurality of memory structure layers has a plurality of taps separated by a delay on the order of milliseconds.

5. The layered memory structure of claim 1, wherein the first memory structure layer of the plurality of memory structure layers has an output that is input to a second memory structure layer of the plurality of memory structure layers.

6. The layered memory structure of claim 1, further comprising an adder, the adder configured to add outputs of the plurality of memory structure layers to produce an output signal.

7. The layered memory structure of claim 1, wherein each memory structure layer of the plurality of memory structure layers multiplies a coefficient vector by an output vector of the memory function of the memory structure layer, the coefficient vector being updated at a frequency that is based on an evaluation period of the memory structure layer.

8. A method of compensating for non-linearity of an electronic device, the method comprising:
receiving an input signal to a memory structure, the memory structure having K layers, each layer having a corresponding memory function, each corresponding memory function having a different evaluation period, where K is an integer greater than 1;
for each corresponding memory function:
delaying the input signal of the memory function by multiple delay elements;
tapping an output of each of a plurality of the multiple delay elements to produce a plurality of memory function outputs;
applying a coefficient vector to the plurality of memory function outputs, the coefficient vector, the coefficient vector being updated at a frequency corresponding to the evaluation period of the memory function; and
wherein an evaluation period of a first memory function is on the order of nanoseconds, an evaluation period of a second memory function is on the order of microseconds, and an evaluation period of a third memory function is on the order of milliseconds.

9. The method of claim 8, wherein the K layers are connected electrically in series to produce a distortion signal.

10. The method of claim 8, wherein outputs of the K layers are summed to produce a distortion signal.

11. The method of claim 8, wherein an evaluation period is implemented using a predetermined delay between taps.

12. A layered memory structure to receive an input signal and to produce a pre-distorted output signal, the layered memory structure comprising:
a first memory structure layer, the first memory structure layer receiving the input signal and having a first set of delay elements, each delay element of the first set introducing a first predetermined delay to a signal path of the received signal, the first predetermined delay based on a first desired period of evaluation by the first memory structure layer;
a second memory structure layer connected in electrical series with the first memory structure layer, the second memory structure layer having a second set of delay elements, each delay element of the second set introducing a second predetermined delay to a signal path of the received signal, the second predetermined delay based on a second desired period of evaluation by the second memory structure layer; and
wherein a predetermined delay for a first memory structure layer of the plurality of memory structure layers is based on a nanosecond evaluation period and a predetermined delay for a second memory structure layer of the plurality of memory structure layers is based on a microsecond evaluation period.

13. The layered memory structure of claim 12, wherein the pre-distorted output signal is obtained from one of the first and second memory structure layers.

14. The layered memory structure of claim 12, wherein the pre-distorted output signal is a sum of the outputs of the first and second memory structure layers.

15. The layered memory structure of claim 12, wherein the first memory structure layer multiplies each output of a delay element of the first set of delay elements by one of a first set of coefficients, the first set of coefficients being based on the first desired period of evaluation.

16. The layered memory structure of claim 15, wherein the second memory structure layer multiples each output of a delay element of the second set of delay elements by one of a second set of coefficients, the second set of coefficients based on the second desired period of evaluation.

* * * * *

UNITED STATES PATENT AND TRADEMARK OFFICE
CERTIFICATE OF CORRECTION

PATENT NO. : 8,645,884 B2
APPLICATION NO. : 13/492190
DATED : February 4, 2014
INVENTOR(S) : Bai It is certified that error appears in the above-identified patent and that said Letters Patent is hereby corrected as shown below:

On the Title Page, Item (56), under "OTHER PUBLICATIONS", in Column 2, Lines 4-5, delete "Manuscript revised Oct. 2010. consisting of 12-pages." and insert -- Manuscript received Jul. 2, 2010 and revised Oct. 2010, consisting of 12-pages. --, therefor.

In the Specification

In Column 4, Line 27, delete "y((n)" and insert -- y(n) --, therefor.

In Column 5, Line 67, delete "pre-distorted 110," and insert -- pre-distorter 110, --, therefor.

In Column 8, Line 65, in Eq. 8, delete "$f_{k,q}(n) = f_{k,-1}(n) + \kappa_{k,q} b_{k,q-1}(n-1)$," and insert -- $f_{k,q}(n) = f_{k,q-1}(n) + \kappa^*_{k,q} b_{k,q-1}(n-1)$ --, therefor.

In Column 8, Line 67, in Eq. 9, delete "$b_{k,q}(n) = \kappa_{k,q-1}(n) + b_{k,q-1}(n-1)$," and insert -- $b_{k,q}(n) = \kappa_{k,q} f_{k,q-1}(n) + b_{k,q-1}(n-1)$ --, therefor.

In Column 9, Line 19, delete "$n_k(n)=0$" and insert -- $u_k(n)=0$ --, therefor.

In Column 10, Line 22, delete "$H^H U$," and insert -- $U^H U$, --, therefor.

In Column 11, Lines 56-57, delete "layered memory structure 1202" and insert -- layered memory structure 1200 --, therefor.

Signed and Sealed this
Eighth Day of July, 2014

Michelle K. Lee
*Deputy Director of the United States Patent and Trademark Office*